(12) United States Patent
Sekiguchi et al.

(10) Patent No.: US 9,184,697 B2
(45) Date of Patent: Nov. 10, 2015

(54) OSCILLATION DEVICE

(71) Applicant: CANON KABUSHIKI KAISHA, Tokyo (JP)

(72) Inventors: Ryota Sekiguchi, Tokyo (JP); Yasushi Koyama, Kamakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/201,316

(22) Filed: Mar. 7, 2014

(65) Prior Publication Data

US 2014/0266477 A1    Sep. 18, 2014

(30) Foreign Application Priority Data

Mar. 12, 2013  (JP) .................. 2013-049012
Jan. 31, 2014  (JP) .................. 2014-018094

(51) Int. Cl.
*H03B 7/08* (2006.01)
*H03B 7/12* (2006.01)
*H01Q 1/38* (2006.01)

(52) U.S. Cl.
CPC ... *H03B 7/12* (2013.01); *H01Q 1/38* (2013.01)

(58) Field of Classification Search
CPC .................................. H03B 7/12; H01Q 1/38
USPC ........... 343/750, 751, 700 MS; 331/115, 132, 331/107 T, 105, 96
See application file for complete search history.

(56) References Cited

U.S. PATENT DOCUMENTS

| | | | |
|---|---|---|---|
| 5,511,238 A * | 4/1996 | Bayraktaroglu | ................ 455/81 |
| 7,386,024 B2 | 6/2008 | Sekiguchi et al. | |
| 7,463,104 B2 | 12/2008 | Sekiguchi et al. | |
| 7,684,455 B2 | 3/2010 | Ouchi et al. | |
| 7,709,797 B2 | 5/2010 | Sekiguchi et al. | |
| 7,869,036 B2 | 1/2011 | Kajiki et al. | |
| 7,889,015 B2 | 2/2011 | Sekiguchi et al. | |
| 7,924,107 B2 | 4/2011 | Koyama et al. | |
| 7,933,305 B2 | 4/2011 | Ouchi et al. | |
| 8,451,069 B2 | 5/2013 | Sekiguchi et al. | |
| 8,779,864 B2 | 7/2014 | Ouchi et al. | |
| 2007/0279136 A1* | 12/2007 | Koyama et al. | ............ 331/107 T |

(Continued)

FOREIGN PATENT DOCUMENTS

| | | |
|---|---|---|
| JP | H10-261917 A | 9/1998 |
| JP | 2007-295350 A | 11/2007 |
| JP | 2012-257073 A | 12/2012 |

*Primary Examiner* — Arnold Kinkead
(74) *Attorney, Agent, or Firm* — Fitzpatrick, Cella, Harper & Scinto

(57) ABSTRACT

An oscillation device comprises a substrate and a plurality of resonance structures arranged on the substrate to resonate electromagnetic waves. Each of the plurality of resonance structures has a negative differential resistance device for generating electromagnetic waves, a first conductor arranged electrically in contact with the negative differential resistance device and a second conductor arranged electrically in contact with the negative differential resistance device and disposed on the opposite side to the first conductor with respect to the negative differential resistance device. Adjacently located resonance structures of the plurality of resonance structures are interconnected by means of a metal part adapted for capacitive coupling with the first conductors thereof. The plurality of resonance structures are arranged so as to be separated from each other at least by a distance not greater than a wavelength of electromagnetic waves to be oscillated by them.

13 Claims, 12 Drawing Sheets

(56) References Cited

U.S. PATENT DOCUMENTS

| | | |
|---|---|---|
| 2011/0089516 A1 | 4/2011 | Sekiguchi |
| 2011/0248724 A1 | 10/2011 | Sekiguchi |
| 2012/0119838 A1 | 5/2012 | Koyama et al. |
| 2012/0256811 A1* | 10/2012 | Colburn et al. ............... 343/907 |
| 2012/0313719 A1 | 12/2012 | Kawasaki |
| 2013/0328635 A1* | 12/2013 | Sekiguchi .................... 331/105 |
| 2014/0124885 A1 | 5/2014 | Sekiguchi et al. |
| 2014/0197896 A1* | 7/2014 | Ouchi et al. ............... 331/107 T |

* cited by examiner

CORRELATION BETWEEN Re[$Y_{12}$]
AND MIM REGION LENGTH ($l_n$)

CORRELATION BETWEEN STRIPLINE LENGTH
(x or y) AND MIM REGION LENGTH ($l_n$)

OSCILLATION DEVICE

BACKGROUND OF THE INVENTION

1. Field of the Invention

The present invention relates to an array type oscillation device. More particularly, the present invention relates to an array type oscillator or oscillation device, that outputs electromagnetic waves containing at least frequency components in the frequency region from the millimeter wave band to the terahertz band (between 30 GHz and 30 THz) (to be referred to as terahertz waves hereinafter).

2. Description of the Related Art

Structures having a resonator and a negative differential resistance device are useful as devices for oscillating electromagnetic waves. For example, oscillation devices or oscillators that generate terahertz waves by means of a negative differential resistance device such as a resonant tunneling diode and an antenna are known. The oscillation output of such an oscillation device shows a tendency of decreasing its intensity as the frequency of the electromagnetic waves the device oscillates is raised toward the higher frequency side. For instance, while the output level of such a device is in the category of milliwatts for a frequency of about 100 GHz, the output level falls to get into the category of microwatts for a frequency of about 1 THz. Such a fall of output level is attributable to micronization of the junction area of the negative differential resistance device that is inevitably adopted in response to the use of a higher oscillation frequency.

Generally, in the field of negative differential resistance devices, the function of an RC low-pass filter is known to be realized by means of junction capacitance Cj and serial resistance Rs that corresponds to the resistance from the negative differential resistance device to the resonator. Namely, because higher frequency components of a signal are cut off by the function of an RC low-pass filter, structures of the above-described type cannot oscillate for electromagnetic waves in the frequency band higher than the cutoff frequency fc ($=(2\pi \times RsCj)^{-1}$). For this reason, the cutoff frequency that provides the upper limit of the frequency band of oscillation of an oscillation device has to be made higher than the frequency band of electromagnetic waves for which the device oscillates. Since the junction capacitance Cj is proportional to the junction area of the negative differential resistance device, the cutoff frequency fc can be raised by reducing the junction area. On the other hand, the electric power with which a bias power supply can feed the negative differential resistance device is proportional to the junction area of the negative differential resistance device. Therefore, as the oscillation frequency rises to a higher frequency, the power that can be fed to the negative differential resistance device falls to consequently reduce the oscillation output.

Formation of an array is known to be an effective means for achieving a sufficiently high output level for the purpose of broadening the scope of application of electromagnetic waves. Japanese Patent Application Laid-Open No. 2007-295350 discloses an exemplar configuration of oscillation device obtained by forming an array of a plurality of elements, which are so many sets of negative differential resistance devices and cavities. As shown in FIG. 14A of the accompanying drawings, a plurality of cavities 3 are formed on a substrate 2 and negative differential resistance devices 4 are arranged at the respective cavities 3. Note that the substrate 2 is laid on a resist layer 7 in FIG. 14A. As shown in FIG. 14B, bias lines 5 are employed to supply power from a bias power supply and electrically connected to the plurality of negative differential resistance devices 4. With such an oscillation device, as one of the negative differential resistance devices is driven to oscillate, adjacently located negative differential resistance devices are put in phase with the first negative differential resistance device and hence come to oscillate in phase with the first negative differential resistance device. Then, the electric power output from the elements 1 can be spatially synthesized (power synthesis) by utilizing this phenomenon. Thus, the above-described structure can provide a large oscillation output (power output) although the structure is relatively compact.

However, in the oscillation device disclosed in Japanese Patent Application Laid-Open No. 2007-295350, adjacently located negative differential resistance devices are directly linked to each other by bias lines. Therefore, isolation of the devices can hardly be secured in a low frequency region and hence the structure is accompanied by a difficulty of suppressing parasitic oscillations. Parasitic oscillations as used herein refer to oscillations induced in a lower frequency band that differs from the intended oscillation frequency band. Since such parasitic oscillations reduce the oscillation output at the intended frequency, suppression of parasitic oscillations that are intrinsically attributable to the structure of an oscillator, or oscillation device, using typical negative differential resistance devices provides an unavoidable problem that has to be solved.

SUMMARY OF THE INVENTION

In view of the above-identified problem, the object of the present invention is to provide an oscillation device having an inter-device structure that is effective for causing adjacently located negative differential resistance devices to oscillate in phase with each other while providing isolation of individual negative differential resistance devices in a lower frequency band relative to the intended oscillation frequency band.

In an aspect of the present invention, there is provided an oscillation device comprising: a substrate; and a plurality of resonance structures arranged on the substrate to resonate electromagnetic waves, each of the plurality of resonance structures having: a negative differential resistance device for generating electromagnetic waves; a first conductor arranged electrically in contact with the negative differential resistance device; and a second conductor arranged electrically in contact with the negative differential resistance device on the opposite side to the first conductor with respect to the negative differential resistance device, wherein adjacently located resonance structures of the plurality of resonance structures are interconnected by means of a metal part adapted for capacitive coupling with the first conductors thereof, and wherein the plurality of resonance structures are arranged so as to be separated from each other by a distance not greater than a wavelength of electromagnetic waves to be oscillated by them.

In another aspect of the present invention, there is provided an oscillation device comprising: a substrate; and a plurality of resonance structures arranged on the substrate to resonate electromagnetic waves, each of the plurality of resonance structures having: a negative differential resistance device for generating electromagnetic waves; and a first conductor arranged electrically in contact with the negative differential resistance device, wherein adjacently located resonance structures of the plurality of resonance structures are interconnected by means of a metal part adapted for inductive coupling with the first conductors thereof, and wherein the plurality of resonance structures are arranged so as to be separated from each other by a distance not greater than a wavelength of electromagnetic waves to be oscillated by them.

Further features of the present invention will become apparent from the following description of exemplary embodiments with reference to the attached drawings.

DESCRIPTION OF THE EMBODIMENTS

Figure 1A:
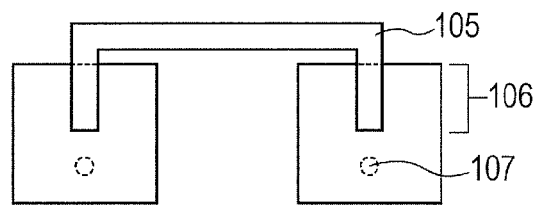
FIGS. 1A and 1B are schematic illustrations of the first embodiment of oscillation device according to the present invention, showing the structure thereof.

An oscillation device according to the present invention comprises a plurality of resonance structures for resonating electromagnetic waves arranged on a substrate and each of the resonance structure has a negative differential resistance device, a first conductor and a second conductor, of which the first and second conductors are arranged at the opposite sides of and electrically held in contact with the negative differential resistance device. Adjacently located resonance structures are electrically connected with each other by means of a metal part adapted to capacitive coupling or inductive coupling with the first conductors thereof so as to obtain an oscillation output by power synthesis and suppress parasitic oscillations.

The principle underlying the present invention will be described below. Metal is selected for the inter-device structure in an embodiment of the present invention. In an array type negative differential resistance oscillator or an oscillation device, a transmission path having an electrical length of about $2\pi$, which corresponds to the oscillation wavelength $\lambda_0$, is formed as a metal part. This length is selected for the purpose of causing the negative differential resistance device for generating an electromagnetic wave to oscillate in phase. The metal part can operate as a capacitive element or an inductive element in a frequency band below the oscillation frequency $\omega_0$. Additionally, a resonance structure, namely a distributed constant type resonator, can be expressed either as a capacitor or as an inductor in the low frequency region below the resonance frequency of the lowest order. According to typical negative resistor arrangements, a resonator of the type that is formed by two oppositely disposed conductors such as a patch antenna and a plasmon waveguide operates as a capacitive element, whereas a resonator of the type that is formed by a single conductor such as a tubular waveguide or a cavity operates as an inductive element. Because of such relations, when the metal part is directly connected to a resonator as inter-device structure, there is a possibility that a resonance frequency or another arises in a frequency band below $\omega_0$ to generate parasitic oscillations. Therefore, direct inter-device connection by means of metal should preferably be avoided to prevent parasitic oscillations from taking place. A technique of utilizing metal as inter-device structure in an array type negative differential resistance oscillator or oscillation device is employing capacitive coupling or inductive coupling (or magnetic field coupling). This is because such a technique can secure inter-device isolation in a low frequency region that can hardly be achieved by direct connection. Preferably, the above-cited couplings are selectively utilized depending on the reactance in the low frequency region of resonance structure as shown below.

(Case where DC Impedance Z ($\omega \rightarrow 0$) is Open Due to Constructed by Two Separate Conductors Such as a Half-Wave Resonator)

Typically, such a resonator is a capacitor in a low frequency region. Therefore, the inter-device metal part between negative differential resistance devices in the resonance structure is preferably adapted to capacitive coupling so that the metal part and the resonator may not produce any resonance frequency.

(Case where DC Impedance Z ($\omega \rightarrow 0$) is Short-Circuited Due to Constructed by a Single Conductor Such as a Quarter-Wave Resonator)

Typically, such a resonator is an inductor in a low frequency region. Therefore, the inter-device metal part between negative differential resistance devices in the resonance structure is preferably adapted to inductive coupling so that the metal part and the resonator may not produce any resonance frequency.

Thus, the present invention discloses an array type negative differential resistance oscillator or oscillation device that oscillates electromagnetic waves such as terahertz waves (electromagnetic waves containing at least partially frequency components in the frequency range not lower than 30 GHz and not higher than 30 THz). Now, the present invention will be described in terms of the embodiments and the examples shown below.

(First Embodiment)

Figure 1B:
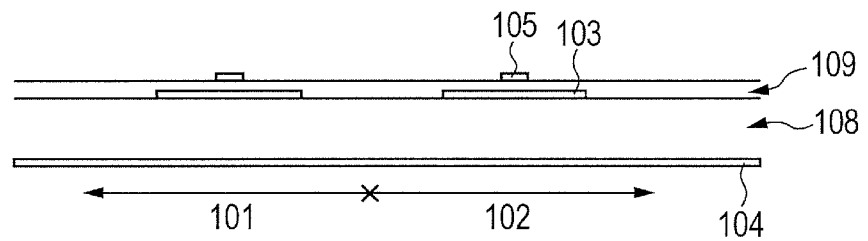

The first embodiment of oscillation device according to the present invention will be described below by referring to FIGS. 1A and 1B. FIGS. 1A and 1B are schematic illustrations of this embodiment of oscillation device. FIG. 1A is a top view and FIG. 1B is a cross sectional view. This embodiment is described below as an array oscillation device comprising only two individual devices for the purpose of simplicity. The gap separating the individual oscillation devices is made to be preferably not greater than the wavelength of electromagnetic waves they oscillate as reduced to the wavelength in vacuum, more preferably not greater than a half of the wavelength. In this embodiment, they are separated by a gap not greater than a half of the wavelength.

In the first embodiment, reference symbols 101 and 102 denote individual oscillation devices. The oscillation wavelength of each of the individual oscillation devices is controlled by the profile of the microstrip resonator formed by a metal layer 103 that is the first conductor operating as part of the antenna of the oscillation device, a dielectric layer 108 and a grounding metal layer 104 that is the second conductor also operating as part of the antenna of the oscillation device. The electromagnetic wave gain for maintaining oscillation is produced by negative differential resistance devices 107. Since the individual oscillation devices 101 and 102 oscillate in phase and in synchronism with each other, the oscillation frequency $\omega_0$ of the oscillation device 101 should be designed to be infinitely close to that of the oscillation device 102. Therefore, the two individual oscillation devices 101 and 102 including a half-wave resonator preferably show a similar profile. Likewise, the two negative differential resistance devices 107 preferably show a similar shape and similar characteristics. A microstrip line 105 as inter-device structure causes the individual oscillation devices to oscillate in phase and in synchronism with each other.

The microstrip line 105 of the metal part that operates as transmission line for forming a link structure is preferably made to show a length as observed between the opposite ends of the metal line 105 that is equal to $2\pi$ in terms of electrical length of the oscillation frequency $\omega_0$ after synchronization. An electrical length of $2\pi$ is the length equal to the effective oscillation wavelength $\lambda_0$ as reduced by the effective permittivity in the surrounding structure. An electrical length of $2\pi$ is selected in order to make the individual oscillation devices to oscillate in phase and in synchronism with each other. A value of $\pi$ or $3\pi$ may be selected when causing the individual oscillation devices to oscillate in anti-phase and in synchronism with each other. As for the length of the metal line 105, the individual devices can be made to oscillate in synchronism with each other if the length is not accurately equal to $2\pi$. Typically about $2\pi \pm 10\%$ will be within the tolerance for the length of the metal line 105, although the tolerance may depend on the magnitude of the inter-device coupling that is produced by the metal line 105. The tolerance is greater than the tolerance for an instance of inter-device coupling without using a metal line 105. Such an electrical length can be ascertained with ease by means of an electromagnetic field simulator or the like.

The oscillation output of the oscillation device 101 is input to the adjacently located oscillation device 102 partly through the microstrip line 105 substantially in phase. Likewise, the oscillation output of the oscillation device 102 is input to the adjacently located oscillation device 101 partly through the microstrip line 105 substantially in phase. A microstrip line 105 is introduced into the array oscillation device of this embodiment in order to bring forth a phenomenon of mutual injection locking.

The metal line 105 of this embodiment is characterized by being capacitively coupled with the metal layer 103 of the resonance structure. These components only form a capacitance in the metal-insulator-metal (MIM) region 106 by way of insulation layer 109 and are DC open. As a result, a large magnitude of inter-device coupling that is comparable with the magnitude of direct coupling can be secured in a frequency band including the oscillation frequency $\omega_0$. Additionally, the magnitude of coupling is reduced in a low frequency region below $\omega_0$ and hence inter-device isolation can be secured. The metal line 105 of this embodiment is advantageous because it has the above-described property. Furthermore, the open-ended microstrip line 105 becomes a capacitive element in a low frequency region below $\omega_0$. Therefore, as viewed from the negative differential resistance device 107 at the side of the device 101, since the metal line 105 is a capacitive element and the metal layer 103 of the resonance structure at the side of the device 102 is a capacitor, no apprehended risk of generating a resonance frequency in a low frequency region will arise. Thus, appearance of parasitic oscillations in a low frequency region can be suppressed.

Figure 2:
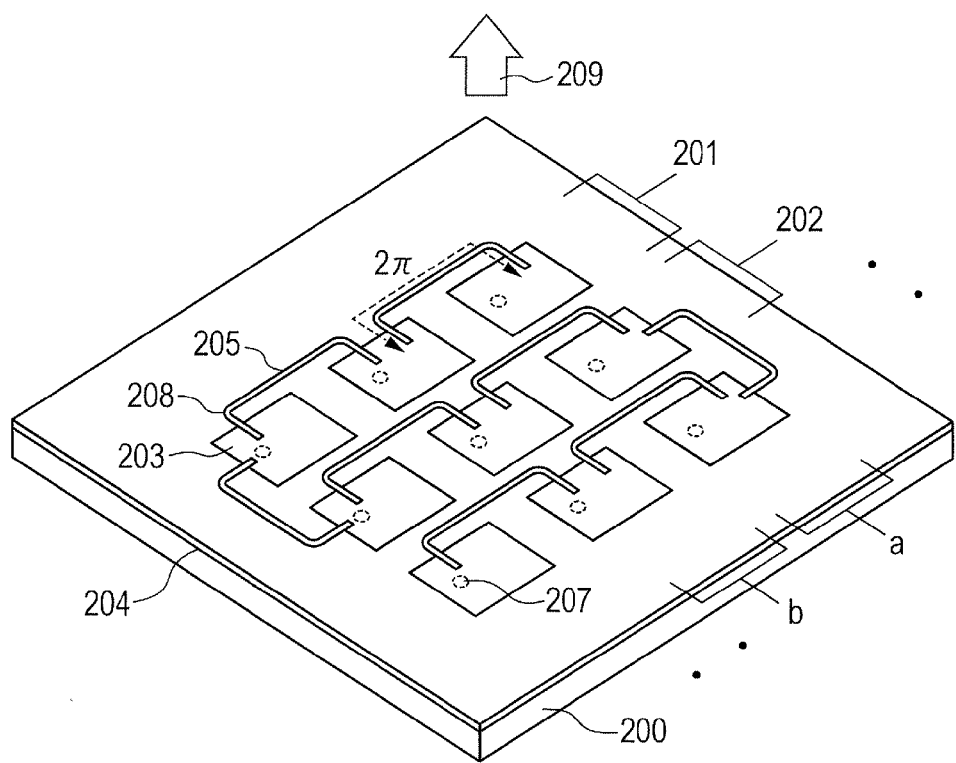
FIG. 2 is a schematic illustration of an alternative arrangement of the first embodiment of oscillation device.

This embodiment is by no means limited to an array oscillation device comprising only two devices. Alternatively, for example, a 9-device array (devices 201a, 201b, ... 202a, 202b, ..., which are so many individual oscillation devices) using patch antenna resonators as shown in FIG. 2 may be formed. The first embodiment can be directly applied to such a device because a patch antenna is formed by oppositely disposed two metal pieces including metal patch 203 and grounding metal 204. More specifically, each of the strips 205 is capacitively coupled with the metals 203 of the corresponding resonator. The electrical length of each of the strips 205 is about $2\pi$. Therefore, all the negative differential resistance devices 207 can be put in phase and in synchronism with each other. A microstrip bend 208 is disposed at each of the bent areas of the strips 205 in order to minimize the loss produced as the result of bending the strips 205. While an example of an array of a plurality of devices arranged on a substrate 200 is described above, an array of such a large number of devices is advantageous because it provides not only large synthesized electric power but also a sharp directivity 209.

In an array type oscillation device designed with an objective of power synthesis, the gap d separating adjacently located individual oscillation devices is made to be preferably not greater than wavelength $\lambda_0$ of oscillated electromagnetic waves as reduced to the wavelength in vacuum, more preferably not to be greater than a half of the wavelength. In other words, individual oscillation devices are arranged at regular intervals of preferably not greater than the wavelength of oscillated electromagnetic waves as reduced to the wavelength in vacuum, more preferably not greater than a half of the wavelength. At this time, the side lobe level of the electric power synthesized from the electromagnetic oscillations of the individual devices at the far field falls so that an oscillation output showing a sharp directivity can be obtained. Additionally, in an array type oscillation device designed with an objective of power synthesis, the pitch of the individual oscillation devices is preferably not greater than the wavelength of or equal to integer times of the wavelength of oscillated electromagnetic waves, more preferably not greater than a half of the wavelength of oscillated electromagnetic waves to obtain synthesized electric power showing a sharp directivity as a result of suppressing the side lobe level.

Figure 7:
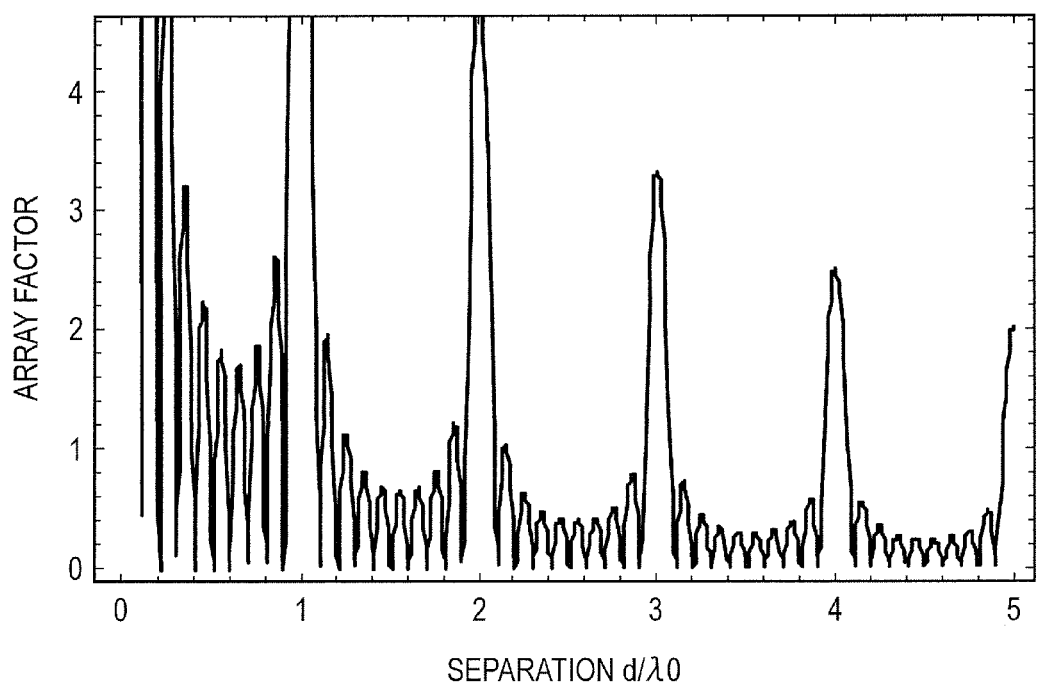
FIG. 7 is a graph illustrating the correlation between the pitch (d), or arrangement, of devices and the array factor (AF).

FIG. 7 is a graph illustrating the correlation between the gap (d) separating devices and the array factor (AF), which is observed perpendicularly above the broad side, of a 10-device linear array as an exemplar array arrangement of this embodiment. The array factor indicates the directivity that is determined only by the array arrangement. An array factor that is equal to or greater than 1 means that the interference of waves is intensified in the direction of observation in a free space so as to give rise to an effect of power synthesis. The device gap $(d/\lambda_0)$ shows the value obtained by normalizing the gap separating the devices of the array by the wavelength in vacuum. From the results of analysis in FIG. 7, an effect of power synthesis can be obtained at the far field when the device gap is made to be not greater than the wavelength of or equal to integer times of the wavelength of oscillated electromagnetic waves, more preferably not greater than a half of the wavelength of oscillated electromagnetic waves. Particularly, in the case of microstrip antennas such as patch antennas, the side lobe level is suppressed when the antennas are arranged at a pitch of not greater than the wavelength in vacuum. Preferably, the pitch of arrangement of devices is not greater than a half of the wavelength to obtain synthesized power showing a sharp directivity at the far field because of suppression of the side lobe level.

Figure 3:
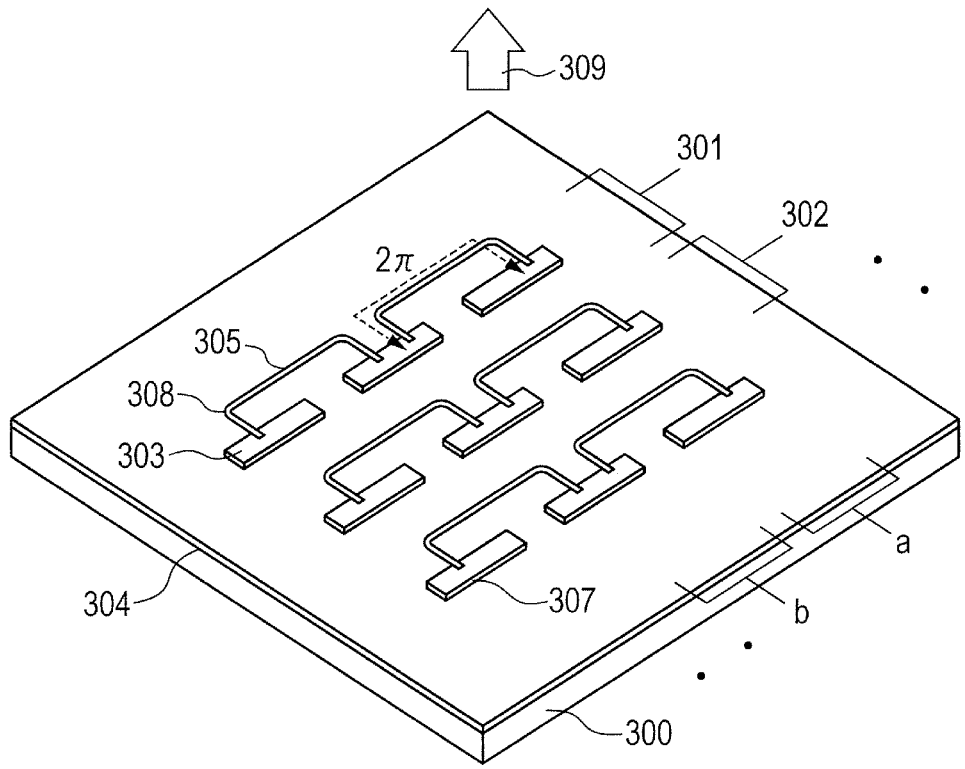
FIG. 3 is schematic illustration of another alternative arrangement of the first embodiment of oscillation device.

Likewise, a 9-device array (devices 301a, 301b, ..., 302a, 302b, ..., which are so many individual oscillation devices) using plasmon waveguide resonators as shown in FIG. 3 may be employed. Each of the plasmon waveguide resonators that are used here operates at the opposite ends thereof as half-wave resonator with an oscillation frequency of $\lambda_0$ and is formed by oppositely disposed two metal pieces including metal clad 303, which is the first conductor, and grounding metal 304, which is the common second conductor. Namely, the first and second conductors operate as part of the plasmon waveguide. Negative differential resistance device 307 is sandwiched between the corresponding one of the first conductors and the common second conductor. By applying the first embodiment, a metal strip 305 having an electrical length of $2\pi$ is arranged between each pair of device 301a and device 301b. Each metal strip 305 having bends 308 is capacitively coupled with corresponding metal 303 of resonator. A technique of inter-device coupling without using metal is jointly employed in this embodiment and magnetic coupling is utilized between device 301a and corresponding device 302a. A single plasmon waveguide oscillation device can be designed so as to show an output greater than a single patch antenna oscillation device but the former is inferior to the latter in terms of directivity. This is because the directivity of a single plasmon waveguide oscillation device is split into a direction parallel to the surface of the substrate 300 and a direction perpendicular to the surface of the substrate 300. However, by forming an array of a plurality of devices on the substrate 300 as shown in FIG. 3, the directivity that is parallel to the surface of the substrate 300 is nullified by an offset effect among the devices to leave only the direction that is perpendicular to the surface of the substrate 300 effective so that the device as a whole can be made to show single directivity. Furthermore, directivity 309 can effectively be obtained by arranging devices 301a, 301b, ..., in the resonance direction with a gap preferably not greater than the oscillation wavelength, more preferably not greater than a half of the oscillation wavelength, in vacuum. Thus, a plasmon waveguide array arranged on a substrate in the above-described manner provides a preferable example.

(Second Embodiment)

Figure 4A:
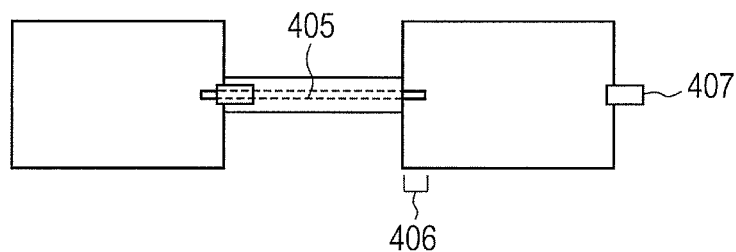
FIGS. 4A and 4B are schematic illustrations of the second embodiment of oscillation device according to the present invention, showing the structure thereof.
Figure 4B:
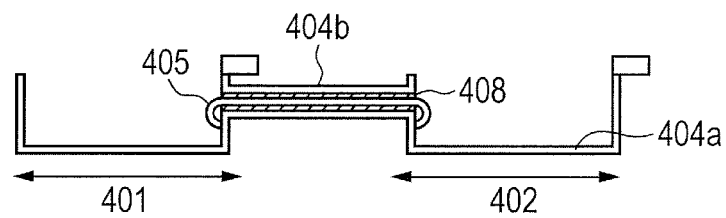

Now, the second embodiment of oscillation device will be described below by referring to FIGS. 4A and 4B. FIGS. 4A and 4B are schematic illustrations of this embodiment of oscillation device. FIG. 4A is a top view and FIG. 4B is a cross sectional view. Again, this embodiment is described below as array oscillation device comprising only two individual devices for the purpose of simplicity. In this embodiment too, the gap separating the individual oscillation devices is made to be preferably not greater than the wavelength, more preferably not greater than a half of the wavelength of electromagnetic waves they oscillate as reduced to the wavelength in vacuum.

In the second embodiment, 401, 402 denote individual oscillation devices. The oscillation wavelength of each of the individual oscillation devices is controlled by the profile of the cavity, one of the surfaces of which cavity is formed by metal walls having open ends 404 (404a, 404b). The electromagnetic wave gain for maintaining oscillation is produced by negative differential resistance devices 407. The resonator operates as quarter-wave oscillator in which voltage antinodes appear at the open ends thereof. Coaxial line 405 provides an inter-device structure for causing the individual oscillation devices to oscillate in phase and in synchronism with each other. The signal line of the coaxial line 405 is separated from the grounding metal 404 by insulator 408. The length of the device between the opposite ends of the metal line 405 as observed along the metal line 405 is preferably made to be equal to the electrical length $\pi$ of the oscillation frequency $\omega_0$ after synchronization. Then, the oscillation output of the oscillation device 401 is input to the adjacently located oscillation device 402 partly through the coaxial line 405 substantially in anti-phase. Likewise, the oscillation output of the oscillation device 402 is input to the adjacently located oscillation device 401 partly through the coaxial line 405 substantially in anti-phase. A coaxial line 405 is introduced into the array oscillation device of this embodiment in order to bring forth a phenomenon of mutual injection locking. This is a part of the above-described arrangement that differs from the arrangement of the above-cited Japanese Patent Application Laid-Open No. 2007-295350, according to which the coaxial line also operates as bias supply line.

The metal line 405 of this embodiment is characterized by being inductively coupled with the resonator 404a. These components form mutual inductance with TM mode of the cavity 404a in loop region 406 and are DC short-circuited. Large inter-device coupling can be secured in the frequency band of the oscillation frequency $\omega_0$. On the other hand, inter-device isolation can be secured because the magnitude of coupling is reduced in a low frequency region below the oscillation frequency $\omega_0$. The metal line 405 of this embodiment is advantageous because it has the above-described property. Furthermore, the coaxial line 405 with ends short-circuited becomes an inductive element in a low frequency region below $\omega_0$. Therefore, as viewed from the negative differential resistance device 407 at the side of the device 401, since the line 405 is an inductive element and the resonator 404a at the side of the device 402 is an inductance, no apprehended risk of generating a resonance frequency in a low frequency region will arise. Thus, appearance of parasitic oscillations in a low frequency region can be suppressed. Note that, in FIG. 4B, a substrate is arranged under the metal wall 404 (404a, 404b) and the metal wall is arranged by digging the substrate and formed by a material same as that or different from that of the substrate.

Figure 5:
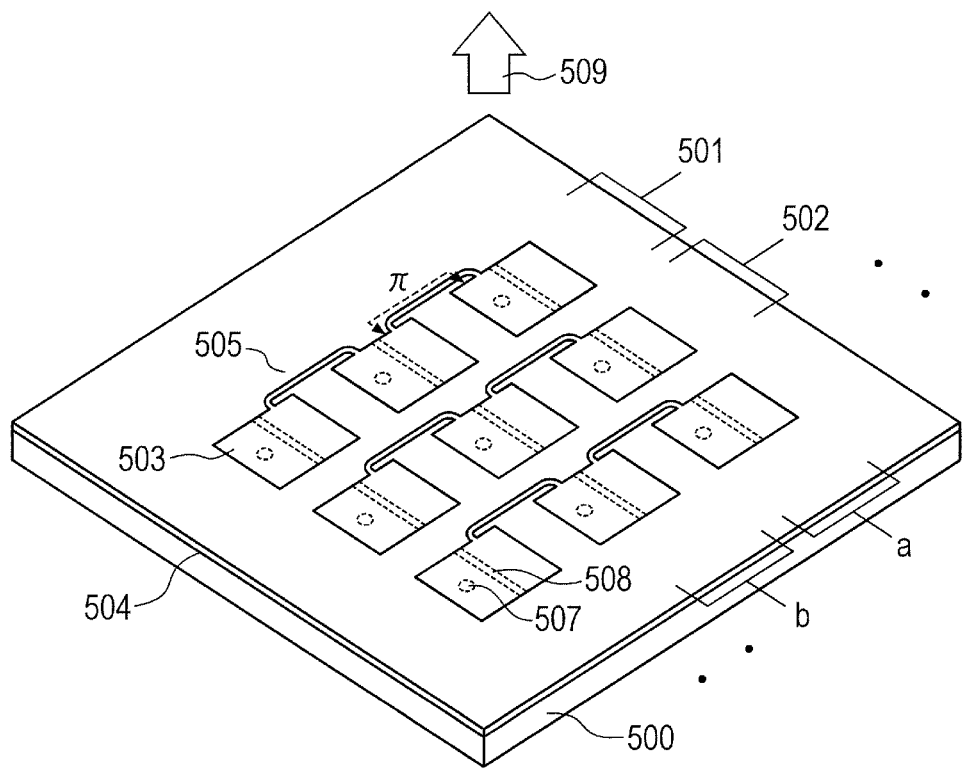
FIG. 5 is a schematic illustration of an alternative arrangement of the second embodiment of oscillation device.

Again, this embodiment is by no means limited to an array oscillation device comprising only two devices. Alternatively, for example, a 9-device array (501a, 501b, ... m 502a, 502b, which are so many individual oscillation devices) using short-circuit type patch antenna resonators as shown in FIG. 5 may be formed. A short-circuit type patch antenna is formed by short-circuiting two pieces of metal including metal patch 503 and grounding metal 504 that are disposed oppositely relative to each other by way of through hole 508 to integrally combining the two metal pieces. As the center part of a half-wave ($\lambda_0/2$) in the direction of resonance is short-circuited in the width direction, a pseudo-quarter wave cavity is produced. Thus, the second embodiment can directly be applied to such a device. More specifically, each of the metal strips 505 is inductively coupled with the metals 503 of the corresponding resonators. $\pi$ or a value close to it is selected for the electrical length of each of the metal strips 505 because they are also DC short-circuited. This is to make the metal strips 505 with ends short-circuited reliably operate as inductive elements in a low frequency region below the oscillation frequency $\omega_0$. Since the coupling position of each of the metal strips 505 is shifted by phase $\pi$ in the corresponding one of the resonators 503, all the negative differential resistance devices 507 can be put in phase and in synchronism with each other. A technique of inter-device coupling without using metal is also jointly employed in this embodiment and magnetic coupling is utilized between device 501a and corresponding device 502a. An exemplar array of a plurality of devices formed on a substrate 500 is described above. Of course, any number of devices greater than nine may be used to obtain effective directivity 509.

An oscillation device according to the present invention will be described more specifically in the following examples.

EXAMPLE 1

Figure 6A:
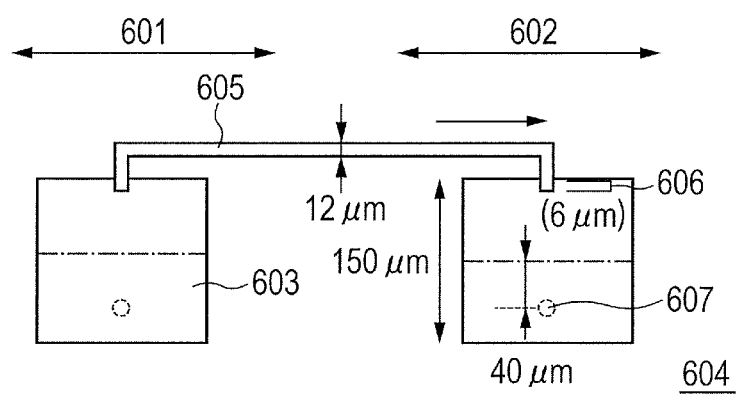
FIG. 6A is a schematic illustration of the oscillation device of Example 1, showing the structure thereof.
Figure 6B:
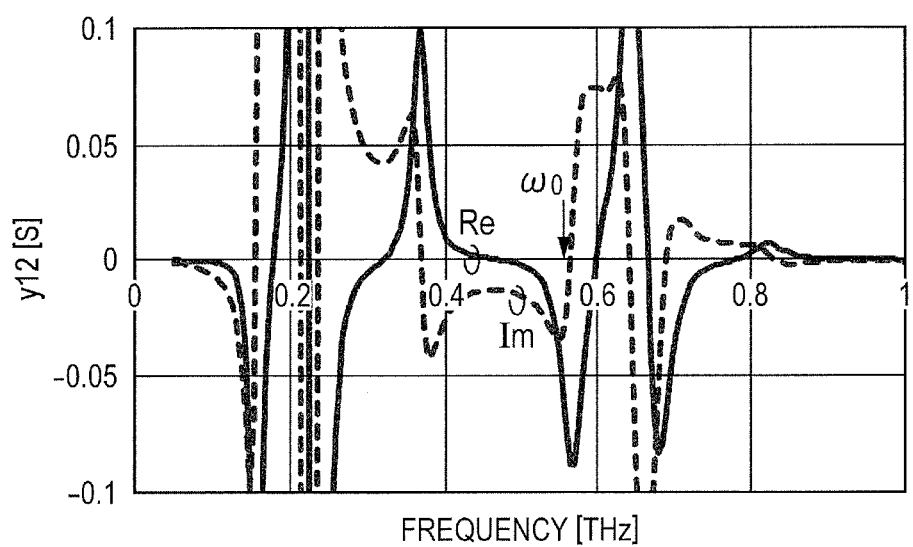
FIGS. 6B and 6C are graphs showing the results of admittance calculations conducted by means of an electromagnetic field simulator.
Figure 6C:
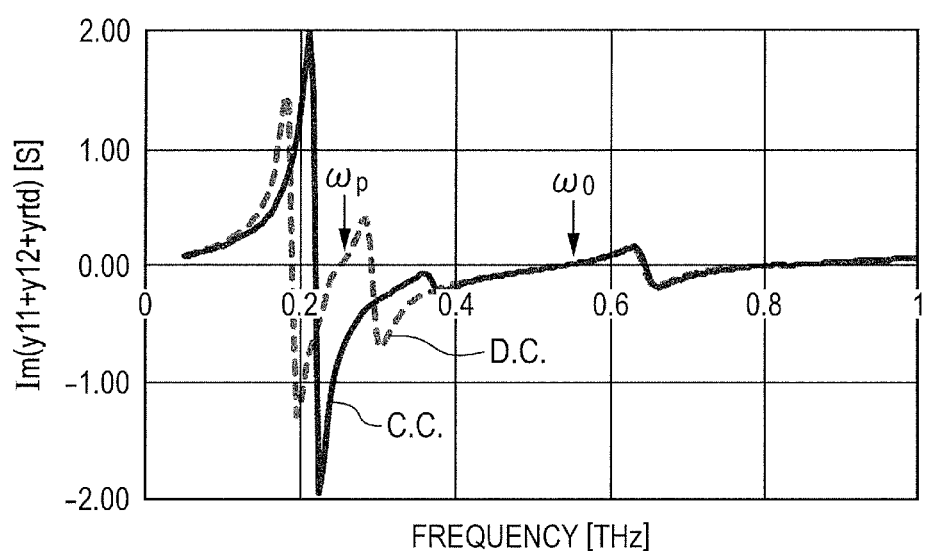

Example 1 that corresponds to the first embodiment will be specifically described below. The oscillation device with two-device array of this example will be described below by referring to FIGS. 6A through 6C. FIG. 6A is a top view of the oscillation device of this example and FIGS. 6B and 6C are graphs showing the results of electric circuit calculations conducted in this example. These graphs specifically support the above-described quantitative discussions.

The first embodiment of the present invention was actually formed in this example. The patch antenna array of this example was for oscillations at about 0.5 THz. FIG. 6A shows design details. The length of the patch antennas 603 in the direction of resonance was made to be equal to 150 μm. Square patches were used in this example. The negative differential resistance devices 607 are arranged at positions offset from the centers of the respective patches by 40 μm as viewed in the direction of resonance and electrically brought into contact with the metal patches 603 and the grounding conductor 604. The gaps between the patches 603 and the grounding conductor 604 were filled with a dielectric showing a relatively small loss in the terahertz band (benzocyclobutene (BCB)) to a thickness of 3 μm. In the individual oscillation devices 601, 602, a microstrip line 605 having a width of 12 μm and a total length of 440 μm that was to be capacitively connected to the metal patches 603 was bent twice and arranged between the neighboring devices. The capacitance between the microstrip line 605 and the metal patches 603 was designed to be 6 fF and the length of the MIM region 606 was designed to be equal to 6 μm.

Resonant tunneling diodes that show lattice matching relative to an InP substrate were selected as negative differential resistance devices 607. However, Esaki diodes or Gunn diodes may alternatively have been selected instead of the resonant tunneling diodes. A resonant tunneling diode 607 is formed with a multiple quantum well structure of InGaAs/InAlAs, InGaAs/AlAs and electrical contact layers of n-InGaAs on an InP substrate. A triple barrier structure may typically be employed for the multiple quantum well structure. More specifically, it may be formed as semiconductor multilayer film structure of AlAs (1.3 nm)/InGaAs (7.6 nm)/InAlAs (2.6 nm)/InGaAs (5.6 nm)/AlAs (1.3 nm). Of the above layers, InGaAs is a well layer and InAlAs that shows lattice matching and AlAs that does not show lattice matching are barrier layers. These layers are intentionally not doped with carriers. In other words, they are undoped layers. The multiple quantum well structure is sandwiched between electrical contact layers of n-inGaAs with an electron density of $2 \times 10^{18}$ cm$^{-3}$. Of the current-voltage I(V) characteristics of the inter-electrical contact layer structure of being sandwiched between electrical contact layers, the peak current density is 280 kA/cm$^2$ and the voltage range between about 0.7 V and about 0.9 V becomes a negative differential resistance region. When the diodes 607 have a mesa structure with a diameter of 2 μm, a peak current of 10 mA and a negative differential resistance of –20Ω are obtained. The oscillation frequency will be about 0.55 THz when the reactance that is accompanied by the coupling capacitance of the resonant tunneling diodes having a diameter of 2 μm and connected to the lower parts of the patches 603 are taken into consideration.

FIGS. 6B and 6C are graphs showing the results of simulations conducted by means of a high frequency full-wave electromagnetic field simulator HFSS v12 (available from ansoft). In FIGS. 6B and 6C, $y_{11}$ is the admittance of the entire structure as viewed from the negative differential resistance device 607 of the device 601 and $y_{12}$ is the mutual admittance between the negative differential resistance device 607 of the device 601 and the negative differential resistance device 607 of the device 602, while $y_{rtd}$ is the admittance of the above-described diodes. $-y_{12}$ that is proportional to the coupling constant ideally has a large real part and an imaginary part that is equal to nil.

At the oscillation frequency $\omega_0$=0.55 THz of the two-device array of this example, Re[$y_{12}$]=–0.08S as shown in FIG. 6B. This is a relatively large value if compared with the negative conductance of –0.05S, indicating that inter-device coupling is secured in the oscillation frequency provided that the coupling is capacitive coupling. Also as shown in FIG. 6B, the value of Im[$y_{12}$] is substantially equal to nil to evidence that the electrical length of the microstrip line 605 is about $2\pi$. The argument of $-y_{12}$ may safely be considered to be corresponding to the electrical length.

Im[$y_{11}+y_{12}+y_{rtd}$] indicates the resonance frequency as two-device array. The nil point shows the resonance frequency. Similar calculations were conducted for an instance where the metal strip 605 and the metal patches 603 are directly coupled to produce a similar arrangement as reference. In FIG. 6C, C.C. indicates the capacitive coupling of this example and D.C. indicates the direct coupling of the reference. Resonance tunneling diodes can oscillate at a parallel resonance frequency. As will be seen from FIG. 6C, oscillation can take place only at frequency $\omega_0$ in the instance of the capacitive coupling (C.C.) of this example, whereas oscillation can take place at two frequencies $\omega_0$ and $\omega_p$ in the instance of the direct coupling (D.C.) of the reference. In other words, the arrangement of this example can oscillate at an intended oscillation frequency without giving rise to any resonance frequency in the frequency band below $\omega_0$. The design of this example is preferable because the two adjacently arranged devices are coupled to a sufficient extent so as to oscillate in phase and in synchronism with each other in the oscillation frequency band.

The above-described design is applicable to arrangements for an array of not less than three devices. A coupling effect that can make all the component devices oscillate in synchronism with each other can be obtained by up to about ten devices. The synthesized electric power advantageously becomes large when the number of device is large.

The oscillation device of this example can be manufactured by way of the below-described process. Firstly, a plurality of layers are sequentially formed on an InP substrate by epitaxial growth, using a molecular beam epitaxy (MBA) technique, a metal-organic vapor phase epitaxy (MOVPE) technique or the like. More specifically, n-InP/n-inGaAs layers and InGaAs/InAlAs layers are sequentially formed by epitaxial growth. Thereafter, an n-InGaAs layer is formed by epitaxial growth because an n-type electroconductive substrate is employed as InP substrate. At this time, a resonant tunneling diode layer and an electrical contact layer are also formed by conducting various known processing steps including those of etching, cleaning, impurity injection and exposure. Additionally, the resonant tunneling diode layer 607 is etched to make it show the shape of cylindrical mesa. Further, the resonant tunneling diode layer 607 is etched to make it show the arc-shaped mesa. While a dry etching technique using EB (electron beam) lithography and ICP (inductively coupled plasma) is employed for the above etching, photolithography may alternatively be employed. Substantially, a grounding conductor 604 of Ti/Pd/Au layers is formed on the surface of the electrical contact layer by means of a lift-off technique. BCB film is formed to a film thickness of about 3 μm at the areas that become resonators by making the n-InP/n-InGaAs layers become exposed by means of spin coating and dry etching. Individual devices are completed as metal patches 604 having Ti/Pd/Au layers are formed by means of a lift-off technique. Finally, the entire surfaces of the individual devices 601, 602 are coated with silicon oxide film by means of plasma CVD and the aluminum layer 605 is patterned to produce the finished oscillation device of this example.

Bias power may preferably be supplied to the resonant tunneling diodes of this example by connecting bias lines to the individual oscillation devices 601, 602. For instance, a technique of using bias tees may be conceivable to prevent parasitic oscillations that are attributable to bias lines from taking place. The array type oscillation device of this example is advantageous as basic arrangement for obtaining oscillation outputs (electric power) by power synthesis and at the same time suppressing parasitic oscillations.

Another specific oscillation device that includes bias lines and bias circuits will be described below in the following example.

EXAMPLE 2

Figure 8:
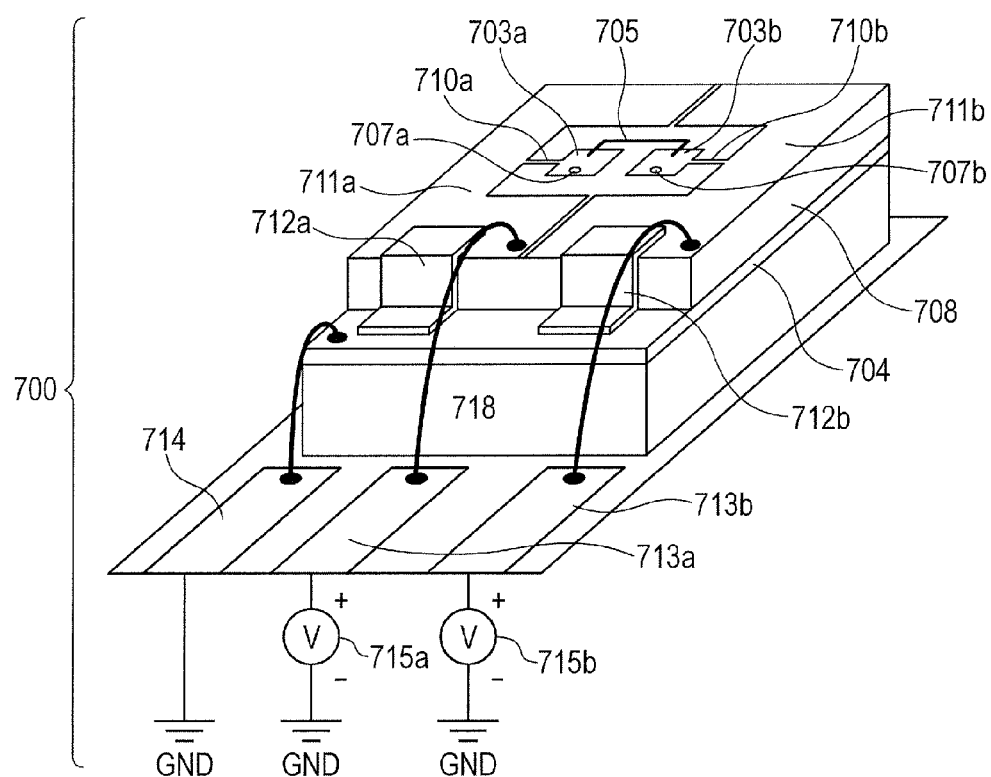
FIG. 8 is a schematic illustration of the oscillation device of Example 2.
Figure 9A:
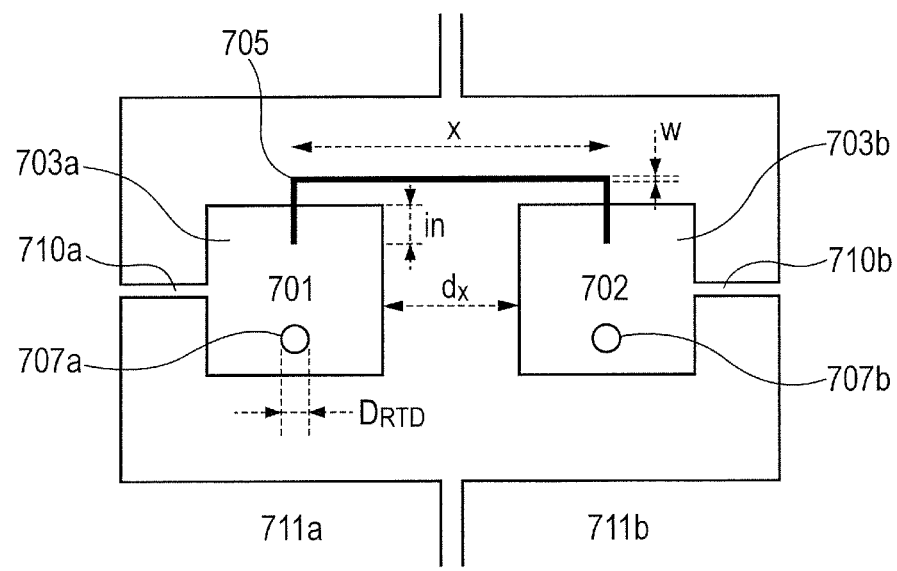
FIG. 9A is a schematic illustration of the oscillation device of Example 2, showing the structure thereof.
Figure 9B:
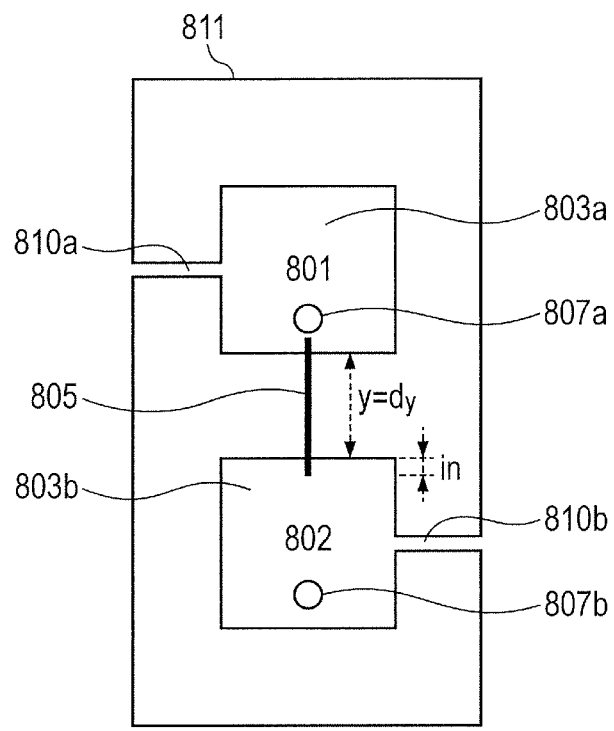
FIG. 9B is a schematic illustration of a modified construction of Example 2.
Figure 10A:
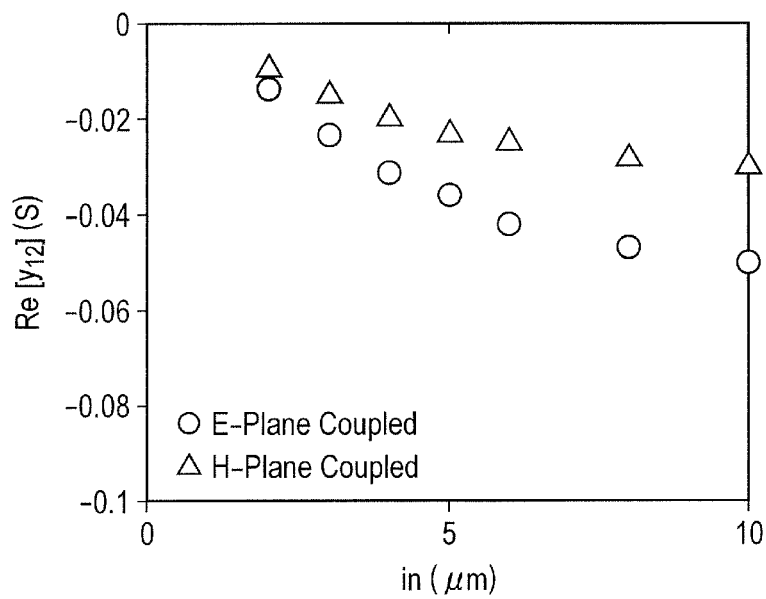
FIGS. 10A and 10B are design examples for oscillation devices corresponding to the structures illustrated in FIGS. 9A and 9B respectively.
Figure 10B:
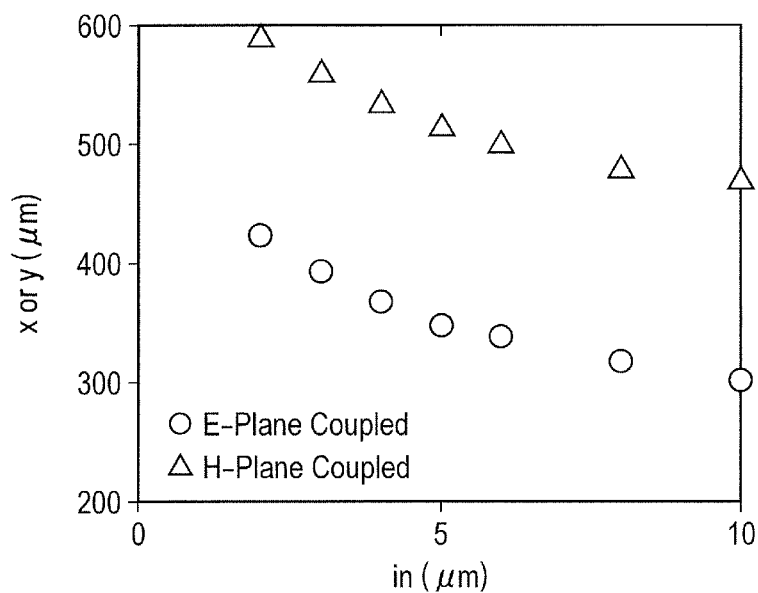
Figure 11:
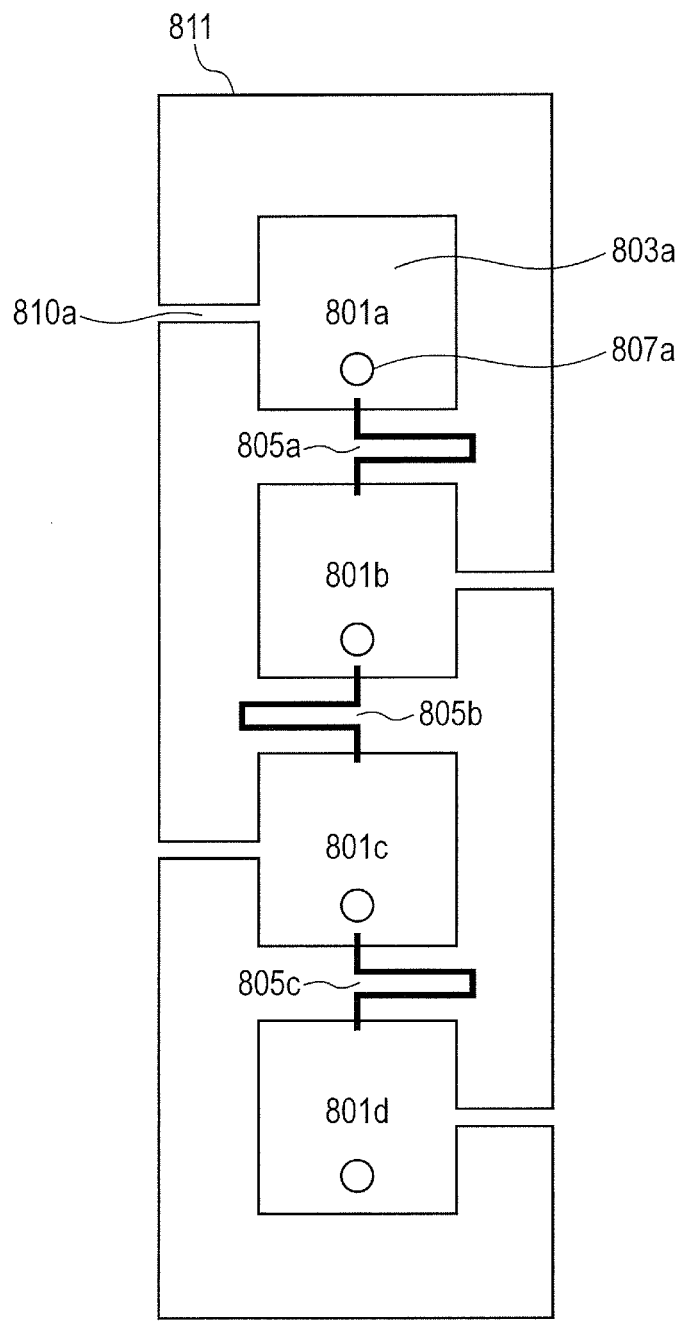
FIG. 11 is a schematic illustration of an alternative arrangement of Example 2.
Figure 12:
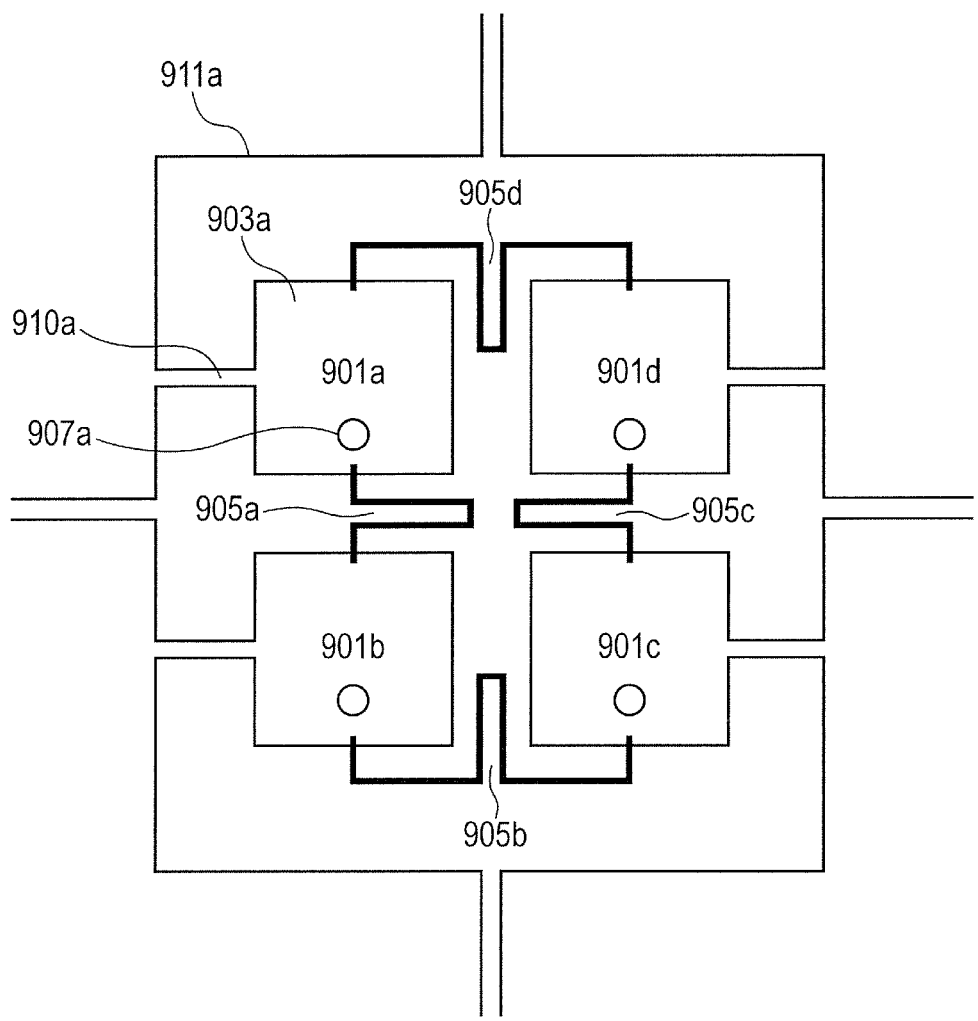
FIG. 12 is a schematic illustration of another alternative arrangement of Example 2.
Figure 13:
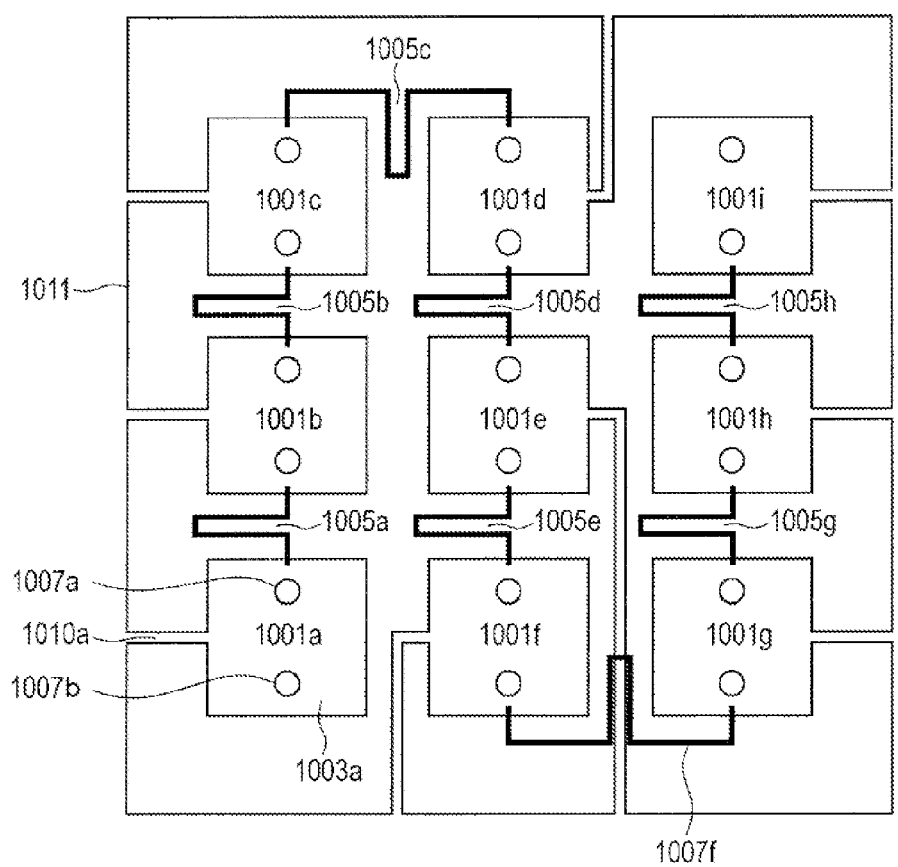
FIG. 13 is a schematic illustration of still another alternative arrangement of Example 2.
Figure 14A:
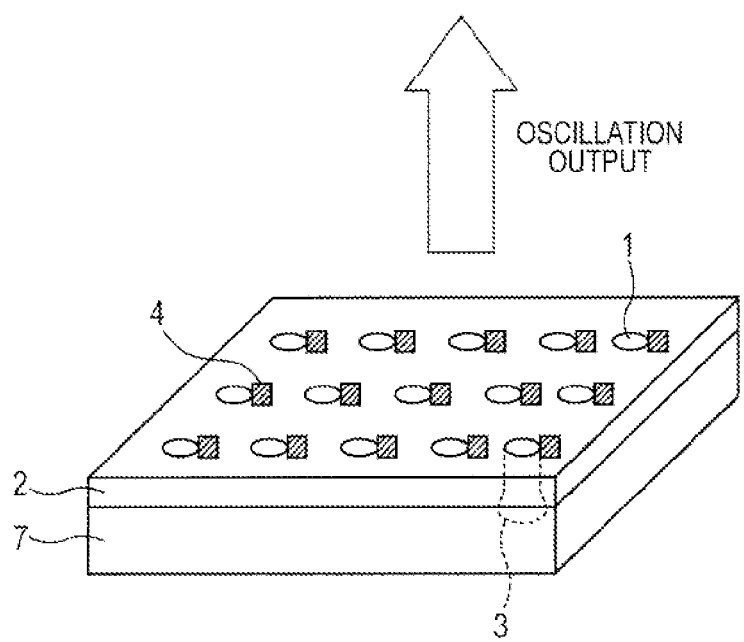
FIGS. 14A and 14B are schematic illustrations of a known oscillation device, showing the structure thereof.
Figure 14B:
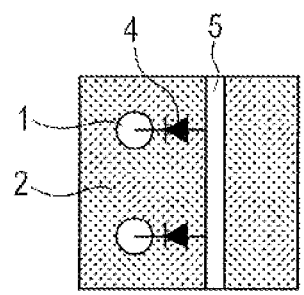

The oscillation device 700 of this example shows a more actually applicable arrangement relative if compared with the arrangements of the first embodiment and Example 1. The oscillation device 700 of this example will be described below by referring to FIGS. 8 through 13. FIGS. 8 and 9A are schematic views of the oscillation device 700 of Example 2 and FIG. 9B is a schematic view of an oscillation device obtained by modifying the device 700 of Example 2. FIGS. 10A and 10B are schematic illustrations of design examples of oscillation device obtained by way of electric circuit computations and structure analyses on the basis of the arrangements of oscillation devices shown in FIGS. 9A and 9B. FIGS. 11 through 13 show the oscillation devices obtained by modifying the device of this example. The component members of the oscillation device of this example that are the same as or similar to those of Example 1 will not be described in detail below.

The oscillation device 700 was a two-device array of two individual oscillation devices 701 and 702 that were H-plane coupled. As shown in FIG. 8, the oscillation device 700 was obtained by integrally combining an array antenna same as that of Example 1 and a feed circuit on substrate 718. The oscillation device 700 was designed to oscillate at about 0.4 THz. In this example again, resonant tunneling diodes (RTDs) of the type described in Example 1 were employed as negative differential resistance devices 707a and 707b and the mesa structure of each of the RTDs was made to show a diameter ($D_{RTD}$) of 3 μmΦ.

Patch antennas 703a and 703b were square patches with the length of 200 μm in the direction of resonance. The negative differential resistance devices 707a and 707b were arranged at positions offset from the centers of the respective patches by 80 μm as viewed in the direction of resonance and electrically brought into contact with the metal patches 703a and 703b and the grounding conductor 704 as they were sandwiched between the respective patch antennas 703a and 703b and grounding conductor 704. Dielectric (BCB) 708 was filled into the gap separating the patches 703a and 703b and the grounding conductor 704 to a thickness of 3 μm.

The metal patches 703a and 703b are respectively connected to MIM capacitances 711a and 711b that are parallel capacitances by way of strip conductors 710a and 710b having a width of 5 μm and a length of 50 μm. The strip conductors 710a and 710b are arranged at the centers of the respective metal patches 703a and 703b in the direction of resonance. These positions substantially agree with the nodes of the terahertz wave that are constantly located at the patch antennas 703a and 703b at an oscillation frequency of 0.4 THz. At this time, the strip conductors 710a and 710b never interfere with the electric fields resonating in the patch antennas 703a and 703b at 0.4 THz.

Resistors 712a and 712b and the MIM capacitors 711a and 711b that are arranged in parallel with the resistors form low impedance circuits. They are arranged in parallel with the negative differential resistance devices 707a and 707b. This arrangement suppresses parasitic oscillations attributable to resonance at a relatively low frequency that can be caused by the bias circuits including power sources 715a and 715b and wirings 713a and 713b. The resistance value of the resistors 712a and 712b is made to be equal to or slightly smaller than the absolute value of the negative differential resistance in the negative differential resistance region of the negative differential resistance devices 707a and 703b. In this example, the resistors 712a and 712b connect between the upper conductors (top conductors) of the respective MIM capacitances 711a and 711b and the grounding conductor 704 at 10Ω. The resistors 712a and 712 are made of bismuth that is semimetal. Two pieces of bismuth film, each having dimensions of 200 μm×200 μm×1 μm (thickness) were formed by means of a lift-off technique so as to obtain a resistance value of 10Ω. Note, however, that the resistors 712a and 712b may alternatively be linear resistors formed by using a metal material such as nickel chromium or an electroconductive resin material or non-linear resistors formed using a semiconductor material.

The resistance value of the MIM capacitors 711a and 712b was so selected as to make the impedance of the MIM capacitors 711a and 712b equal to or lower than the absolute value of the negative differential resistance of the negative differential resistance devices 707a and 707b in a microwave frequency band. The capacitance of the MIM capacitors 711a and 712b is preferably large. In this example, the capacitance was made to be about 20 pF by means of the MIM (metal-insulator-metal) structures integrally formed on the same substrate with the oscillation devices. The MIM capacitors 711a and 711b were connected to the respective wirings 713a and 713b that included wire bonding. The grounding conductor 704 was connected to GND lines 714. With the above-described arrangement, bias voltages are independently supplied respectively from the power sources 717a and 717b to the negative differential resistance devices 707a and 707b and appropriately adjusted.

As shown in FIG. 9A, the individual oscillation devices 701, 702 are connected respectively to the metal patches 703a and 703 by way of a U-shaped microstrip line 705 having a width (w) of 4 μm. By exploiting the resonance electric field and the distance x in the perpendicular direction of the U-shaped microstrip line 705 and the length in of the MIM regions, the total length of the U-shaped microstrip line 705 was made to be equal to 2×(in+50 μm)+x. The gap between the metal patches 703a and 703b and the microstrip line 705 was $h_{SiN}$, which was filled with silicon nitride (SiNx) to a thickness of 0.2 μm in this example. The distance separating the adjacently arranged oscillation devices 701 and 702 is expressed by $d_x$. Then, in this example, the coupling intensity between the adjacently arranged devices can be adjusted mainly by means of in, w and $h_{SiN}$. The degree of phase matching between the adjacently arranged devices can be adjusted by means of the length x, whereas the degree of power syntheses of the adjacently arranged devices can be adjusted by means of the distance $d_x$.

FIG. 9B shows another two-device array of individual oscillation devices 801, 802 that are E-plane coupled. This two-device array is obtained by modifying oscillation device having a two-device array of this example. Note that, in this device, the oscillation devices 801, 802 are provided with a common MIM capacitor 811 and a bias voltage can be supplied from a common power source and adjusted appropriately. This arrangement is advantageous for reducing the number of wirings and improving the degree of freedom of layout and design. With this arrangement, metal patches 803a and 803b are capacitively connected to each other by a microstrip line 805 having a width (w) of 4 μm and arranged in the direction of the resonance electric field of the patches. By exploiting the resonance electric field and the distance y in the parallel direction of the microstrip line 805 and the length in of the MIM region, the total length of the microstrip line 805 was made to be equal to 2×in+y. The distance separating the adjacently arranged oscillation devices 801 and 802 is expressed by $d_y(=y)$. Then, in this modified example, the coupling intensity between the adjacently arranged devices that are E-plane coupled can be adjusted mainly by means of in, w and $h_{SiN}$. The degree of phase matching between the adjacently arranged devices can be adjusted by means of the length y, whereas the degree of power syntheses of the adjacently arranged devices can be adjusted by means of the distance $d_y$.

FIGS. 10A and 10B are schematic illustrations of design examples of H-plane coupled and E-plane coupled two-device arrays of this example computationally obtained by way of electric circuit computations and structure analyses. FIG. 10A shows the correlation between the degree of coupling intensity that is expressed as $Re[y_{12}]$ and the length in of the MIM region. As it gets longer, the capacitance of the MIM region becomes greater so that $Re[y_{12}]$ decreases accordingly (and the absolute value thereof increases). FIG. 10B shows the correlation between the length x of the strip line with which the two devices becomes phase-matched in an even mode and the length in of the MIM region. The value of $Im[y_{12}]$ becomes substantially equal to nil. Differently stated, if x or y is so selected for the length of the microstrip line as to make the argument of $-y_{12}$ equal to 180°, the two devices becomes phase-matched in an even mode. When the electrical length is taken into consideration, the length x substantially corresponds to $2\pi$, while the length y substantially corresponds to n. The length x or y of the microstrip line at which the two devices become phase-matched in an even mode gets shorter as the length in of the MIM region is made longer to intensify the coupling. Thus, a design arrangement that intensifies the coupling of adjacent devices and hence increases the absolute value of $Re[y_{12}]$ is advantageous for power synthesis because inter-device distances $d_x$ and $d_y$ decrease.

FIG. 11 shows a four-device linear array of E-plane coupled devices and FIG. 12 shows a 2×2 array of E-plane/H-plane coupled devices, while FIG. 13 shows a 3×3 array of E-plane/H-plane coupled devices as exemplar modifications of the device of Example 2. Note that folded strip lines 805, 905 and 1005 are employed as link structures for inter-device coupling. With these arrangements, the strip line lengths x and y and the inter-device distances $d_x$ and $d_y$ can be controlled independently. In other words, with these design arrangements, the inter-device electrical length and the extent of power synthesis can be adjusted independently. In the 3×3 array of E-plane/H-plane coupled devices shown in FIG. 13, push-pull type oscillation devices 1001a through 1001g, each of which is provided with two negative differential resistance devices 1007a and 1007b, are arranged to make the device advantageous for achieving a large output.

Thus, the above-described embodiments of the present invention that are array type oscillators or oscillation devices that oscillate electromagnetic waves such as terahertz waves using negative differential resistance devices, can provide oscillation outputs (electric power) due to power synthesis and, at the same time, suppress parasitic oscillations.

Industrial Applicability

An oscillation device according to the present invention can be expected to find applications in the fields of manufacturing control, diagnostic medical imaging, safety control and so on as an element device.

While the present invention has been described with reference to exemplary embodiments, it is to be understood the invention is not limited to the disclosed exemplary embodiments. The scope of the following claims is to be accorded the broadest interpretation so as to encompass all such modification and equivalent structures and functions.

This application claims the benefit of Japanese Patent Application Nos. 2013-049012, filed Mar. 12, 2013, and 2014-018094, filed Jan. 31, 2014, which are hereby incorporated by reference herein in their entirety.

What is claimed is:

1. An oscillation device comprising:
   a substrate; and
   a plurality of resonance structures arranged on the substrate to resonate electromagnetic waves,
   each of the plurality of resonance structures having:
   a negative differential resistance device for generating electromagnetic waves;
   a first conductor arranged electrically in contact with the negative differential resistance device; and
   a second conductor arranged electrically in contact with the negative differential resistance device on the opposite side to the first conductor with respect to the negative differential resistance device,
   wherein adjacently located resonance structures of the plurality of resonance structures are interconnected by means of a metal part adapted for capacitive coupling with the first conductors thereof, and
   wherein the plurality of resonance structures are arranged so as to be separated from each other by a distance not greater than a wavelength of electromagnetic waves to be oscillated by them.

2. The device according to claim 1, wherein
   the resonance structures are arranged so as to be separated from each other by a distance not greater than a half of the wavelength of electromagnetic waves to be oscillated by them.

3. The device according to claim 1, wherein
   the resonance structures are half-wave resonators.

4. The device according to claim 1, wherein the metal parts are transmission lines having an electrical length of $\pi$ or $2\pi$.

5. An oscillation device comprising:
a substrate; and
a plurality of resonance structures arranged on the substrate to resonate electromagnetic waves,
each of the plurality of resonance structures having:
   a negative differential resistance device for generating electromagnetic waves; and
   a first conductor arranged electrically in contact with the negative differential resistance device;
wherein adjacently located resonance structures of the plurality of resonance structures are interconnected by means of a metal part adapted for inductive coupling with the first conductors thereof, and;
wherein the plurality of resonance structures are arranged so as to be separated from each other by a distance not greater than a wavelength of electromagnetic waves to be oscillated by them.

6. The device according to claim 5, wherein the resonance structures are arranged so as to be separated from each other at least by a distance not greater than a half of the wavelength of the electromagnetic waves to be oscillated by them.

7. The device according to claim 5, wherein the resonance structures are quarter-wave resonators.

8. The device according to claim 5, wherein the metal parts are transmission lines having an electrical length of $\pi$ or $2\pi$.

9. The device according to claim 1, wherein the negative differential resistance devices are resonant tunneling diodes.

10. The device according to claim 1, wherein both the first and second conductors are each formed by a metal.

11. The device according to claim 1, wherein the first and second conductors in each of the plurality of resonance structures are parts of an antenna.

12. The device according to claim 1, wherein the first and second conductors in each of the plurality of resonance structures are parts of a plasmon waveguide.

13. The device according to claim 1, wherein the frequency of electromagnetic waves include a part of the frequency region not lower than 30 GHz and not higher than 30 THz.

* * * * *